(12) United States Patent
Liu et al.

(10) Patent No.: US 12,500,109 B2
(45) Date of Patent: Dec. 16, 2025

(54) ELECTROSTATIC CHUCK THAT INCLUDES UPPER CERAMIC LAYER THAT INCLUDES A DIELECTRIC LAYER, AND RELATED METHODS AND STRUCTURES

(71) Applicant: ENTEGRIS, INC., Billerica, MA (US)

(72) Inventors: Yan Liu, Lexington, MA (US); Jakub Rybczynski, Arlington, MA (US); Caleb Minsky, Medfield, MA (US); Steven Donnell, Burlington, MA (US)

(73) Assignee: ENTEGRIS, INC., Billerica, MA (US)

( * ) Notice: Subject to any disclaimer, the term of this patent is extended or adjusted under 35 U.S.C. 154(b) by 89 days.

(21) Appl. No.: 17/974,019

(22) Filed: Oct. 26, 2022

(65) Prior Publication Data

US 2023/0136703 A1    May 4, 2023

Related U.S. Application Data

(60) Provisional application No. 63/272,729, filed on Oct. 28, 2021.

(51) Int. Cl.
*H01L 21/683* (2006.01)
*C23C 16/40* (2006.01)
*C23C 16/455* (2006.01)

(52) U.S. Cl.
CPC ........ *H01L 21/6833* (2013.01); *C23C 16/403* (2013.01); *C23C 16/45525* (2013.01); *H01L 21/683* (2013.01)

(58) Field of Classification Search
CPC .............. H01L 21/6833; H01L 21/683; H01L 21/6831; H02N 13/00; C23C 16/403; C23C 16/45525; C23C 16/455

USPC .......................................................... 361/234
See application file for complete search history.

(56) References Cited

U.S. PATENT DOCUMENTS

| | | | |
|---|---|---|---|
| 9,692,325 B2 | 6/2017 | Suuronen | |
| 10,395,963 B2 | 8/2019 | Cooke | |
| 2003/0161088 A1* | 8/2003 | Migita | ............... H01L 21/6831 361/234 |
| 2007/0227027 A1* | 10/2007 | Holzapfel | .......... G01D 5/34707 33/706 |
| 2008/0049374 A1 | 2/2008 | Morioka et al. | |
| 2008/0174930 A1 | 7/2008 | Hattori et al. | |
| 2008/0315536 A1 | 12/2008 | Miyazawa et al. | |
| 2009/0284893 A1 | 11/2009 | Ando | |
| 2011/0141650 A1* | 6/2011 | Fujisawa | ............ H01L 21/6732 361/234 |
| 2014/0063682 A1 | 3/2014 | Anada et al. | |
| 2014/0204501 A1 | 7/2014 | Moriya et al. | |
| 2014/0367570 A1 | 12/2014 | Kimba | |
| 2015/0214087 A1* | 7/2015 | Stone | .................... C23C 28/044 427/576 |

(Continued)

FOREIGN PATENT DOCUMENTS

| | | |
|---|---|---|
| JP | H0831917 A | 2/1996 |
| JP | 2011148687 A | 8/2011 |

(Continued)

*Primary Examiner* — Danny Nguyen (57) ABSTRACT

Described are electrostatic chuck devices that are useful to support a workpiece while processing the workpiece, upper ceramic layer components of electrostatic chuck assemblies, the upper ceramic layer having a deposited dielectric layer, a relatively smooth finish, or both, and related methods.

20 Claims, 2 Drawing Sheets

(56) References Cited

U.S. PATENT DOCUMENTS

| | | | |
|---|---|---|---|
| 2020/0035469 A1* | 1/2020 | Momiyama | H01L 21/68757 |
| 2020/0144941 A1 | 5/2020 | Chen | |
| 2020/0227300 A1 | 7/2020 | Lee | |
| 2022/0388914 A1* | 12/2022 | Miura | C04B 37/003 |
| 2023/0136703 A1 | 5/2023 | Liu | |

FOREIGN PATENT DOCUMENTS

| | | |
|---|---|---|
| JP | 2012119704 A | 6/2012 |
| KR | 20160117436 A | 10/2016 |
| TW | I550762 B | 9/2016 |
| TW | I739642 B | 9/2021 |
| WO | 2005083752 A2 | 9/2005 |
| WO | 2008053934 A1 | 5/2008 |
| WO | 2015120265 A1 | 8/2015 |
| WO | 2016158110 A1 | 10/2016 |

* cited by examiner

ELECTROSTATIC CHUCK THAT INCLUDES UPPER CERAMIC LAYER THAT INCLUDES A DIELECTRIC LAYER, AND RELATED METHODS AND STRUCTURES

This application claims the benefit under 35 USC 119 of U.S. Provisional Patent Application No. 63/272,729, filed Oct. 28, 2021, the disclosure of which is hereby incorporated herein by reference in its entirety.

FIELD

This disclosure relates to electrostatic chuck devices that are useful to support a workpiece during a step of processing the workpiece; to upper ceramic layer components of electrostatic chuck assemblies, the upper ceramic layer having a deposited dielectric layer, a relatively smooth surface, or both; and to related methods.

BACKGROUND

Electrostatic chucks are used in semiconductor and microelectronic device processing. An electrostatic chuck supports a workpiece such as a semiconductor wafer or microelectronic device substrate to perform a process on the workpiece. The lower surface of the workpiece is supported at an upper surface of the chuck, while at the same time the chuck places a downward force on the workpiece by use of an electrostatic attractive force between the workpiece and the chuck.

The chuck includes an upper layer made of dielectric material such as a ceramic. Beneath the upper ceramic layer, at a lower surface of the upper ceramic layer, is an electrode layer. In operation, voltage is applied to electrodes of the electrode layer and that voltage induces a charge within the supported workpiece. The induced charge in the workpiece has an opposite polarity from the voltage applied to the electrode. The opposite charges between the electrode layer and the supported workpiece create an electrostatic attraction between the workpiece and the chuck. This electrostatic attraction places a downward force on the workpiece toward the upper surface of the chuck to maintain the position of the workpiece while processing the workpiece.

The chuck includes various structures, devices, and designs that allow the chuck to perform. Typical electrostatic chuck assemblies are multi-component structures that include: a flat upper surface that supports a workpiece; electrical components such as electrodes, a conductive coating at the upper surface, ground connections to remove an electrostatic charge from the chuck or a supported workpiece; one or more cooling systems to control a temperature of the chuck or supported workpiece; various other components that may include measurement probes, sensors, and moveable pins that are adapted to support or to change a position of a workpiece relative to the chuck; a base layer to support the upper ceramic layer; and cooling and electrical connections to connect the chuck to a tool interface.

As the workpiece is being processed, the workpiece is supported by the upper surface of the chuck and held down against the upper surface by the electrostatic charge induced in the workpiece. After the processing step is completed, the voltage to the electrodes is turned off, the induced charge dissipates or is preferably removed, and the workpiece can be lifted up from the chuck.

Ideally, the upper ceramic layer of an electrostatic chuck is a perfect insulator that during operation would not be affected by a voltage applied to the electrodes beneath the ceramic layer. The ceramic layer would not exhibit any charge caused by the voltage at the electrodes, either by induction or conduction.

That would be the ideal effect between an electrode and a perfectly insulative ceramic layer. In a real-world system, though, ceramic materials are not perfect insulators, and a charged electrode that contacts a surface of a ceramic layer will result in a non-zero flow of electrical charge from the electrode to the ceramic layer. This effect is referred to as electrical charge being "injected" to the ceramic layer, resulting in a "residual" charge that slowly accumulates within the ceramic layer over a period of use of an electrostatic chuck.

If a significant level of residual charge accumulates within a ceramic layer of a chuck, the residual charge can cause difficulties during use of the chuck. The residual charge may cause "sticking" of a workpiece against the top surface of the chuck, which is sometimes referred to as "wafer sticking." Wafer sticking refers to an undesired electrostatic attraction of a chuck to a workpiece, especially after a step of removing a voltage from the electrode of the electrostatic chuck. Wafer sticking may cause the wafer to be difficult to lift from the chuck or to experience unpredictable movement during removal. Sticking may also contribute to wafer breakage.

SUMMARY

This application describes novel electrostatic chuck devices and component layers of novel electrostatic chuck devices. Also described are methods for preparing a ceramic layer of an electrostatic chuck as described, and for preparing a multi-component electrostatic chuck that includes an upper ceramic layer as presently described.

A need exists to reduce or prevent an electrostatic charge from accumulating in a ceramic layer of an electrostatic chuck, during use of the chuck. Charge accumulation is believed to occur by the transfer of electric charge from an electrode at a lower surface of the ceramic layer, to the ceramic layer, when a voltage is applied to the electrode.

The Applicant has determined that this type of charge accumulation in the ceramic layer can be reduced by: imparting a relatively smooth surface on the ceramic layer at locations of contact with the electrode; placing a dielectric layer between the ceramic layer and the electrode; forming the electrode from an electrode material (metal, metal oxide, or other non-metal material) that has a high work function; or two or more of these features in combination.

Electrostatic chuck assemblies as described can include an upper ceramic layer that has an upper surface and a lower surface, with a dielectric layer placed in contact with the lower surface of the ceramic layer between the lower surface and an electrode. The dielectric layer acts as an insulating layer between the electrode and the ceramic layer that may reduce an amount of electrical charge that will flow from the electrode to the ceramic layer and produce residual charge build within the ceramic layer.

Additionally or alternately, the lower surface of the ceramic layer that contacts the electrode may be relatively smooth, i.e., may have a low surface roughness, such as a roughness that is less than or equal to 0.6, 0.4, or 0.1 microns (Ra). The present Applicant has determined that surface roughness of the ceramic layer at the location of the electrode can affect charge transfer, i.e., electrical conduction, from the electrode to the ceramic layer. A relatively lower surface roughness can result in a reduced amount of charge being transferred from the electrode to the ceramic layer during use, compared to an amount of charge that would transfer to the ceramic layer if the surface had a higher roughness. Surface roughness can be measured using by known equipment and methods, such as by use of a Bruker DekTak XT stylus profilometer with stylus 12.5 um tip radius, under force 10 mN, and scan length 2 mm in 60 sec.

Additionally or alternatively, an electrode of an electrostatic chuck may be made from one or more metal materials that exhibit a high work function, e.g., a work function of at least 4.5 or at least 5 electron volts.

In one aspect, the disclosure relates to an electrostatic chuck that includes: a ceramic layer having an upper surface and a lower surface; an electrode at the lower surface, and a dielectric layer between the ceramic layer and the electrode.

In another aspect, the disclosure relates to an electrostatic chuck that includes: a ceramic layer having an upper surface and a lower surface; an electrode at the lower surface; with the lower surface having a surface roughness (Ra) less than or equal to 0.4 micron.

In yet another aspect, the disclosure relates to a method of preparing an electrostatic chuck. The method includes: on a ceramic layer that comprises an upper surface and a lower surface, forming a dielectric layer on the lower surface, and forming an electrode layer on the dielectric layer.

Still another aspect of the disclosure relates to a method of preparing an electrostatic chuck. The method includes: on a ceramic layer that includes an upper surface and a lower surface, the lower surface having a surface roughness (Ra) less than or equal to 0.4 micron, forming an electrode layer on the lower surface.

DETAILED DESCRIPTION

The following description relates to novel electrostatic chuck devices (sometimes referred to herein as "electrostatic chuck assemblies," "electrostatic chucks," or "chucks") and component layers of novel electrostatic chuck devices. Also described are methods for preparing an upper ceramic layer of an electrostatic chuck as described, and for preparing a multi-component electrostatic chuck that includes an upper ceramic layer as presently described.

Example electrostatic chuck devices include an upper ceramic layer that has an upper surface and a lower surface, with a dielectric layer deposited onto the lower surface of the ceramic layer. At that location, the dielectric layer acts as an insulating layer between the electrode and the ceramic layer. The insulating dielectric layer can act as an insulating, non-conductive barrier between the electrode and the ceramic layer that reduces an amount of electrical charge that may flow from the electrode to the ceramic layer and produce residual charge build within the ceramic layer.

Additionally or alternatively, the lower surface of the ceramic layer, which contacts an electrode, may be relatively smooth, e.g., may have a low surface roughness, such as a roughness that is less than or equal to 0.6, 0.5, 0.4, 0.3, 0.2, or 0.1 micron (Ra). Unless otherwise noted, when referring to a roughness of the lower surface, this roughness refers to roughness at a location on the ceramic layer lower surface where an electrode is located, before placement of the electrode, and in the absence of a dielectric layer.

Additionally or alternatively, an electrode of an electrostatic chuck may be made from one or more metal materials that exhibit a high work function, e.g., a work function of at least 4.5 or at least 5 electron volts.

The present Applicant has determined that surface roughness of the ceramic layer at the location of contact with an electrode can affect charge transfer, i.e., electrical conduction, from the electrode to the ceramic layer. A degree of surface roughness of the ceramic layer has been found to affect transfer and a buildup of residual charge within the ceramic layer. Without being bound by any particular theory, it is postulated that local (e.g., minute or microscopic) peaks on a surface of a ceramic layer may have an increased tendency to accept a charge from an adjacent electrode. A ceramic surface that contains higher peaks, measured as a higher roughness (Ra), can allow a larger amount of charge transfer from the electrode to the ceramic layer compared to a ceramic surface that contains lower peaks measured as a lower roughness (Ra).

An electrostatic chuck as described is a multi-piece ("multi-layer" or "multi-component") structure that includes multiple separately-prepared or individually-prepared components that are assembled together as layers that form an electrostatic chuck assembly. The assembly includes various structures and features that are typical of an electrostatic chuck assembly and that allow the chuck to support a workpiece (e.g., semiconductor substrate, a microelectronic device, a semiconductor wafer, a precursor thereof) during processing, while creating an electrostatic attractive force between the workpiece and the chuck that holds the workpiece in place at the upper surface of the chuck. Example workpieces used with an electrostatic chuck include semiconductor wafers, flat screen displays, solar cells, reticles, photomasks, and the like. The workpiece may have an area equal to or greater than that of a circular 100 millimeter diameter wafer, a 200 millimeter diameter wafer, a 300 millimeter diameter wafer or a 450 millimeter diameter wafer.

The chuck includes an upper "workpiece-contacting surface" that is adapted to support a workpiece during processing. The upper surface typically has a circular surface area with a circular edge that defines a perimeter of both the workpiece-contacting surface and the multi-layer chuck. As used herein, the term "workpiece-contacting surface" refers to the upper exposed surface of an electrostatic chuck that contacts a workpiece during use and that includes a "main field" made of ceramic material and having an upper surface, typically with embossments at the upper surface, and with an optional conductive coating that may cover at least a portion of the upper surface. The workpiece is held at the workpiece-contacting surface with the bottom surface of the workpiece being supported by and in contact with upper surfaces of the embossments such that the workpiece is supported a small distance above the upper surface of the ceramic layer.

The chuck includes electrodes that are used to place a downward force on the workpiece to hold the workpiece firmly in place against the workpiece-contacting surface. The electrodes are located beneath the upper ceramic layer. When a voltage is applied to the electrodes, an attractive electrostatic force is created between the chuck and the workpiece. The voltage, having a first polarity, induces a charge of an opposite polarity in the supported workpiece. The opposing charges present with in the workpiece (of one polarity) and the electrodes (of an opposite polarity) create an electrostatic attraction between the electrodes and the supported workpiece. Example electrostatic chuck assemblies may be used with AC and DC Coulombic chucks and Johnsen-Rahbek chucks.

The chuck assembly may also include a number of other layers, devices, structures, or features that are required or useful for the chuck to function. Examples include: a grounding device such as a grounding layer and related electrical connections; measurement devices for measuring pressure, temperature, or an electrical property during use of the chuck; conduits (cooling channels) within a layer of a chuck (e.g., a base) that are useful as part of a temperature control function; backside gas flow function for gas flow and pressure control between the workpiece-contacting surface and a workpiece; a conductive surface coating; as well as others.

One layer of the chuck assembly is an upper ceramic layer (or "ceramic layer" for short) at an upper portion of the assembly. The ceramic layer may be a top layer of the assembly, excluding any of a conductive coating, embossments, or the like, which may be placed on the upper surface of the ceramic layer. The ceramic layer may be made of a useful ceramic, dielectric material. Example materials include alumina ($Al_2O_3$), aluminum nitride, quartz, $SiO_2$ (glass), among others. The ceramic layer may be made of a single (integral) layer of material or may alternately be made of two or more different materials, e.g., multiple layers of different materials, if desired. A thickness of a ceramic layer may be any effective thickness, for example a thickness in a range from 50 microns to 1 millimeter.

The ceramic layer may comprise, consist essentially of, or consist of dielectric material, e.g., ceramic material. A ceramic layer is made of material that provides a dielectric property, along with desired mechanical properties such as stiffness. The ceramic layer may contain at least 90, 95, or 99 weight percent of one or more different ceramic materials.

The ceramic layer is supported below by a base layer ("base" for short), which may be made of a metal, such as aluminum, aluminum alloy, titanium, titanium alloy, stainless steel, or metal matrix composite, among others.

Typically between the ceramic layer and the base is one or more of: a bonding layer (e.g., a polymeric adhesive), an electrode layer that contains one or more electrodes that contact a lower (bottom) surface of the ceramic layer, a grounding layer, an insulating layer that allows the electrodes and other layers to function electrically, or additional circuitry.

Figure 1:
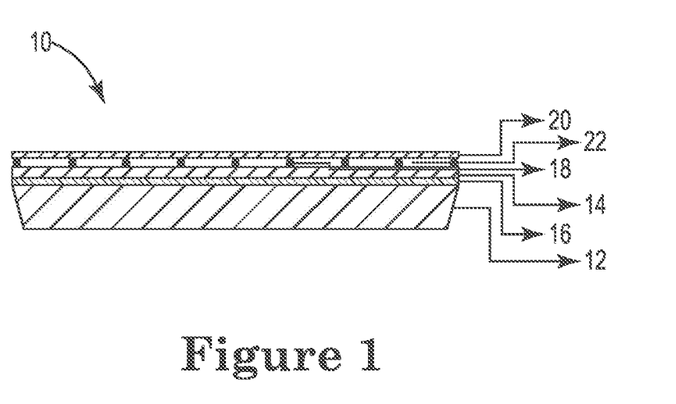
FIGS. 1 and 1A are side-views of an electrostatic chuck assembly as described herein.

An example of a useful chuck assembly is shown at FIG. 1. Chuck assembly 10 includes base 12, ceramic layer ("assembly") 14, and a bonding layer 16 that bonds an upper surface of base 12 to a bottom or lower surface of ceramic layer 14. Ceramic layer 14 also includes an electrode (not specifically shown) disposed at the bottom surface. At an upper surface of ceramic layer 14 is a pattern of embossments 18. As illustrated, a workpiece (shown as wafer 20) is supported by the embossments. A space 22 is present between a lower surface of wafer 20 and an upper of ceramic layer 14. Space 22 is created by embossments 18 located at the upper surface of ceramic layer 14, which support wafer 20 at a slight distance above the upper surface of ceramic layer 14.

According to ceramic layers and electrostatic chuck assemblies of the present description, the ceramic layer of a chuck includes one or both of the following features: i) a low surface roughness at a lower surface of the ceramic layer, at a location of contact with the electrode, ii) a dielectric layer at the bottom surface of the ceramic layer between the bottom surface and an electrode.

A ceramic layer includes a bulk ceramic layer ("ceramic body") that is formed as a ceramic body having an upper surface, a lower surface, and a thickness (typically in a range of 1 to 10 millimeters). The ceramic body is formed by any useful process, with example methods including one or more steps that can include molding or pressing a ceramic material (e.g., ceramic powder) to form a molded or pressed body (sometimes referred to as a "green body"), followed by a high temperature sintering step to cause ceramic particles of pressed or molded body to become bonded together to form the ceramic body. The sintered ceramic body is a rigid ceramic body having an upper surface and a lower surface. The ceramic body can have a uniform composition and a dense form as measured by a low porosity, e.g., a porosity that is below 10 percent, 5 percent, or 2 or 1 percent (pore volume per volume of the bulk ceramic body).

For use in an electrostatic chuck, the upper and lower surfaces are processed to be very flat and to have a desired surface roughness. Typically, an upper surface of a ceramic layer may be formed and processed to have a surface roughness (Ra) of from 0.5 to about 1 micron.

For ceramic layers of previous electrostatic chuck assemblies, a lower surface of the ceramic layer that faces an electrode and an adhesive (bonding) layer is typically processed to have a surface roughness (Ra) of at least 0.6 microns, or not less than 1.0 microns. This level of surface roughness has been used because this level of roughness is effective to produce good adhesion between the ceramic surface and an adhesive of a bonding layer, and good adhesion between the ceramic surface and an electrode that contacts the ceramic surface.

According to this disclosure, the bottom surface (i.e., the surface of the ceramic layer that contacts the bond layer and electrode) of a ceramic layer can be formed and processed to be more smooth than a bottom surface of previous ceramic layers of electrostatic chuck assemblies. The Applicant has determined that the level of roughness of the bottom surface of the ceramic layer, at areas of contact between the bottom surface of the ceramic layer and the electrode, may affect an amount of electrostatic charge that is transferred from the electrode to the ceramic layer.

Roughness of the ceramic layer is a measure of the peak-and-valley micro-geometry of the surface. A larger difference between a top of peaks and a bottom of valleys of the surface, a higher number of peaks and valleys, or both, may allow for a higher amount of electrostatic charge to be transferred from an electrode to the surface compared to an amount of charge that would be transferred to a surface having a smaller difference between the top of peaks and bottom of valleys, or fewer peaks and valleys. A higher roughness of the ceramic layer that contacts the charged electrodes may allow for an increased amount of charge to pass to the ceramic layer from an electrode that contacts the ceramic layer and has a high voltage charge. A relatively smooth surface of a ceramic layer, having reduced peak-to-valley microgeometry levels and fewer peaks and valleys, may reduce the presence or strength of a magnetic field that is produced at the peaks when voltage is applied to the electrode that contacts the ceramic surface. Reducing the strength amount of magnetic fields at the ceramic surface, at microscopic peaks, may reduce an amount of charge that is emitted from the electrode to the ceramic layer that becomes accumulated electrostatic charge within the ceramic layer.

Accordingly, a bottom surface of a ceramic layer of the present description has a relatively smooth surface compared to those used with previous electrostatic chucks, particularly at areas of the surface that contact an electrode. The smoother surface reduces peak-to-valley roughness and can have the effect of reducing an amount of electrical charge that passes from a high-voltage electrode that contacts the ceramic layer, to the ceramic layer. Over a time of use of an electrostatic chuck that contains the ceramic layer with the smoother surface, the amount of residual charge that passes to and accumulates within the ceramic layer will be reduced. Examples of useful or preferred roughness levels of a bottom surface of the ceramic layer may less than or equal to 0.6 micron, 0.5 micron, 0.4 micron, 0.3 micron, 0.2 micron, 0.1 micron, or 0.05 micron.

Figure 1A:
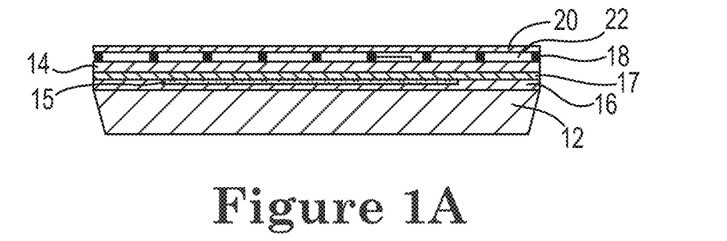

Additionally or alternately, as shown in FIGURE the ceramic layer may include a dielectric layer 17 that is applied to the lower surface that contacts the electrode 15. As used herein a "dielectric layer" is a layer or coating that is made to include dielectric material that has been added onto (e.g., deposited onto) the surface of the ceramic layer, for example by a deposition method such as atomic layer deposition, chemical vapor deposition, physical vapor deposition, etc. The "dielectric layer" is the layer or coating as initially deposited, or a modification or a derivative thereof such as a deposited layer that is subsequently chemically-modified or treated or further processed.

The dielectric layer 17 is an electrically insulating layer that provides electrical insulation and resistance of electrical flow between the ceramic layer 14 and the electrode 15 that contacts the ceramic layer. The dielectric layer 17 can have a high dielectric strength, e.g., a high resistivity (in p ohm-m), for example resistivity that is at least as high as the resistivity of the ceramic layer, preferably higher, for example a resistivity of at least $1 \times 10^{14}$ $\rho$ ohm-m.

Examples of dielectric materials include alumina ($Al_2O_3$), silicon-based ceramic materials (e.g., SiO, SiN), metal oxides such as zirconium oxide or hafnium oxide, combinations of these, or the like. As desired, e.g., based on performance and manufacturing considerations, a dielectric layer applied to a surface of a ceramic layer may be made of the same type of dielectric layer as the material of the ceramic layer. According to a particular example, a ceramic layer may be made of alumina, and a dielectric layer applied to the ceramic layer may also be made of alumina. According to other examples, a dielectric layer may be made of dielectric material that is different from the material of the ceramic layer.

The dielectric layer 17 may comprise, consist essentially of, or consist of dielectric material that is applied to or deposited onto the lower surface of the ceramic layer 14. A dielectric layer is made of one or more materials that have high dielectric strength and that can be applied to form a continuous electrically insulative layer at the lower surface of the ceramic layer. The dielectric layer may contain at least 90, 95, or 99 weight percent of one or more different dielectric materials.

A dielectric layer can exhibit any useful thickness, such as a thickness in a range of nanometers or microns. Useful or preferred dielectric layers may be deposited onto the ceramic layer surface at a thickness and by a technique that allows the dielectric layer to conform to the microstructure present at the surface of the ceramic layer, i.e., the dielectric layer is conformal and does not affect the roughness of the ceramic layer surface by significantly increasing or decreasing a measured surface roughness, e.g., by changing a measured surface roughness by more than 2, 5, or 10 percent. Roughness measured of the ceramic layer, after the dielectric layer is applied to the ceramic layer, can be within a range as described for the ceramic layer before the dielectric layer is applied, e.g., a ceramic layer that includes the dielectric layer applied to the ceramic layer may exhibit a level of roughness that is less than or equal to 0.6 micron, 0.5 micron, 0.4 micron, 0.3 micron, 0.2 micron, 0.1 micron, or 0.05 micron.

Useful thicknesses of a dielectric layer that is applied by a deposition technique, e.g., by atomic layer deposition, may be below 200 nanometers, such as from a few nanometers (e.g., 5 or 10 nanometers) to 400 nanometers (nm), or from 50 or 100 nanometers to 200 nanometers. The dielectric layer 17 may be continuous over the entire surface of the ceramic layer 14, or at least may be continuous over a portion of the ceramic layer 14 surface that contacts an electrode such as electrode 15.

Many methods are known and commercially useful and effective for depositing a layer of a dielectric material onto a ceramic surface. General examples include atomic layer deposition (ALD), chemical vapor deposition (CVD), physical vapor deposition (PVD) (e.g., sputtering), as well as modified versions of these methods, such as plasma-enhanced chemical vapor deposition (PECVD). A dielectric layer that is prepared by a particular type of deposition method may be referred to with reference to the deposition method, e.g., a dielectric layer applied by a chemical vapor deposition method may be referred to as a "CVD dielectric layer"; a dielectric layer applied to the ceramic layer by an atomic layer deposition method may be referred to as a "ALD dielectric layer"; a dielectric layer applied to the ceramic layer by a physical vapor deposition method may be referred to as a "PVD dielectric layer."

While ceramic layers and chuck assemblies as described herein are not limited to any particular method of forming or applying a dielectric layer at a ceramic surface, or to a particular form of the dielectric layer, dielectric layers that exhibit certain properties may be particularly useful. For example, a dielectric layer applied to a ceramic layer to provide an electrical insulating (dielectric) effect, e.g., high resistivity, should be present over the ceramic layer surface as a continuous and substantially defect free layer. Also potentially preferred, the dielectric layer may be relatively dense as applied, and conformal relative to the surface of the ceramic layer.

Accordingly, useful or preferred dielectric layers include ALD dielectric layers, meaning dielectric layers that are applied by atomic layer deposition onto the ceramic layer surface. Atomic layer deposition techniques are effective to produce deposited layers of dielectric material that are relatively dense (compared layers applied by other deposition techniques), have very low levels of defects, are highly conformal, and that exhibit good dielectric properties.

Atomic layer deposition is a method of depositing a very thin layer of a material (here, a dielectric material) onto a substrate material (here, the surface of the ceramic layer). The dielectric layer may be made from a single type of deposited material, or may be made from multiple (e.g., two or more) different materials deposited as alternating layers (sub-layers) within the dielectric layer. According to example ALD dielectric layers, the ALD layer may be made from one single type of dielectric material, such as ZrO, HfO, alumina, etc. According to other example ALD dielectric layers, a deposited ALD dielectric layer may be made from multiple sub-layers of different (e.g., alternating) dielectric materials, for example the dielectric layer may be made of alternating deposited sub-layers of ZrO and HfO.

Advantages that can be achieved with a dielectric layer prepared by atomic layer deposition include: excellent conformity of the dielectric layer to the substrate microstructure (e.g., the applied ALD dielectric layer does not significantly affect a measured surface roughness value); accurate control of the thickness of the dielectric layer; high uniformity of the thickness of the dielectric layer over an area of the layer; the ability to apply two or more different deposited dielectric materials as different sub-layers of a dielectric layer; and the preparation of coatings to have very low levels of defects such as pinholes, cracks, fissures, and grain boundaries.

The electrode layer can include one or multiple separate electrode elements, typically located over a portion of the lower surface of the ceramic layer as a pattern of the one or multiple electrodes. An electrode may be formed or applied to the ceramic layer, or a dielectric layer previously placed on the ceramic layer, by any of a variety of methods, including by a deposition method. One or more electrode of an electrode layer may be applied or deposited onto the ceramic layer surface in the form of a pattern applied to only a portion of the surface. According to other methods, an electrode may be formed on a ceramic layer surface by first applying a continuous layer of conductive (e.g., metal) electrode material over an entire surface of the ceramic layer, followed by a step of removing a portion of the continuous layer by etching to leave a desired pattern to remain.

Various methods are known for depositing a layer of electrode material onto a ceramic surface. General examples include atomic layer deposition (ALD), chemical vapor deposition (CVD), physical vapor deposition (PVD) (e.g., sputtering), as well as many modified versions of these methods such as a plasma-enhanced chemical vapor deposition (PECVD).

An electrode can be made of any metal (including metal alloys) or non-metal that can be effective as an electrode, and that can be processed to form an electrode structure as part of an electrostatic chuck, for example by depositing the electrode onto a surface of the ceramic layer. Example electrode materials include metals, metal alloys, and conductive non-metals titanium nitride, zirconium nitride, chromium nitride, indium tin oxide, among others.

Useful or preferred electrode materials may be metals that have a "work function" that reduces a flow of electros escaping the structure of the electrode in a manner that would allow electrons to escape the electrode and pass to and remain in the dielectric layer as accumulated electronic charge. A "work function" of a metal material is a known property, defined as a minimum energy required for an electron to escape from a metal surface. Preferred electrode materials can be metals that have a work function that is at least 4.5, 5 electron volts (eV). Examples of such metals include Ni, Co, W, Pb, Pt, Ir, and Au.

An electrode may comprise, consist essentially of, or consist of metal that has a work function of at least 4.5 or at least 5 electron volts. A useful electrode material may be a material that is highly conductive, and that can be applied to a surface of a ceramic layer of an electrostatic chuck to function as an electrode, for example by a deposition technique. An electrode layer may contain at least 90, 95, or 99 weight percent of one or more different metal materials, e.g., at least 90, 95, or 99 weight percent of one or more different metal materials that have a work function of at least 4.5 or at least 5 electron volts.

A ceramic layer of a chuck assembly may be prepared by using various useful processing and manufacturing techniques, such as: known techniques to form a ceramic layer body; known techniques to process surfaces of a ceramic layer to a desired surface roughness; and deposition techniques to apply an electrode layer, dielectric layer, or both, to a surface of a ceramic layer.

According to an example, a method for preparing a ceramic layer, or an electrostatic chuck, as described, can include forming an electrode layer on a surface of a ceramic layer. The surface of the ceramic layer can be as described, and may include a dielectric layer, may exhibit a low surface roughness (e.g., less than or equal to 0.6 microns), or both.

The electrode layer and optional dielectric layer may each be formed as a pattern.

Alternately, the electrode layer, a method may include steps that include: depositing the dielectric layer on the lower surface as a non-patterned dielectric layer; depositing the electrode layer on the lower surface, over the dielectric layer, as a non-patterned electrode layer, and removing a portion of the electrode layer by etching, to form a patterned electrode layer.

In a first aspect, an electrostatic chuck comprises: a ceramic layer comprising an upper surface and a lower surface, an electrode at the lower surface, and a dielectric layer between the ceramic layer and the electrode.

In a second aspect according to the first aspect, the dielectric layer is a CVD dielectric layer, an ALD dielectric layer, or a PECVD dielectric layer deposited onto the lower surface.

In a third aspect according to any of the preceding aspects, the dielectric layer has a thickness of less than 200 nanometers.

In a fourth aspect according to any of the preceding aspects, the dielectric layer comprises dielectric material that is different from ceramic material of the ceramic layer.

In a fifth aspect according to any of the preceding aspects, the dielectric layer comprises: alumina ($Al_2O_3$), a silicon-based ceramic material (e.g., SiO, SiN), a metal oxide such as zirconium oxide or hafnium oxide.

In a sixth aspect according to any of the preceding aspects, the ceramic layer comprises alumina and the dielectric layer comprises alumina.

In a seventh aspect according to any of the preceding aspects, the electrode comprises metal having a work function of at least 4.5 electron volts.

In an eighth aspect according to the seventh aspect, the electrode comprises metal selected from Ni, Co, W, Pb, Pt, Ir, and Au.

In a ninth aspect according to any of the preceding aspects, the lower surface has a surface roughness (Ra) less than or equal to 0.4 micron.

In a tenth aspect according to any of the preceding aspects, the lower surface has a surface roughness (Ra) less than or equal to 0.1 micron.

In an eleventh aspect according to any of the preceding aspects, the ceramic layer comprises alumina.

In a twelfth aspect according to any of the preceding aspects, the dielectric layer is an alumina ALD dielectric layer.

In a thirteenth aspect, an electrostatic chuck comprises: a ceramic layer comprising an upper surface and a lower surface, an electrode at the lower surface, the lower surface having a surface roughness (Ra) less than or equal to 0.4 micron.

In a fourteenth aspect according to the thirteenth aspect, the lower surface has a surface roughness (Ra) less than or equal to 0.1 micron.

In fifteenth aspect according to the thirteenth or fourteenth aspect, the electrode comprises metal having a work function of at least 4.5 electron volts.

In a sixteenth aspect according to the fifteenth aspect, the electrode comprises Ni, Co, W, Pb, Pt, Ir, or Au.

In a seventeenth aspect, a method of using an electrostatic chuck of any of the preceding aspects comprises: supporting a semiconductor wafer at the upper surface, applying a voltage to the electrode to induce an opposite voltage in the semiconductor wafer, processing the semiconductor wafer, removing the voltage from the electrode, and lifting the wafer from the upper surface.

In an eighteenth aspect according to the seventeenth aspect, the voltage is a direct current voltage.

In a nineteenth aspect, a method of preparing an electrostatic chuck comprises: on a ceramic layer that comprises an upper surface and a lower surface, forming a dielectric layer on the lower surface, and forming an electrode layer on the dielectric layer.

A twentieth aspect according to the nineteenth aspect, further comprising forming the dielectric layer by a method selected from chemical vapor deposition, plasma-assisted chemical vapor deposition, and atomic layer deposition.

A twenty-first aspect according to the nineteenth aspect, further comprising forming the dielectric layer by atomic layer deposition.

A twenty-second aspect according to any of the nineteenth through twenty-first aspects, further comprising depositing the electrode layer by a method selected from chemical vapor deposition, plasma-enhanced chemical vapor deposition, and atomic layer deposition.

In a twenty-third aspect according to any of the nineteenth through twenty-second aspects, the dielectric layer comprises: alumina ($Al_2O_3$), a silicon-based ceramic material (e.g., SiO, SiN), a metal oxide such as zirconium oxide or hafnium oxide.

In a twenty-fourth aspect according to any of the nineteenth through twenty-third aspects, the dielectric layer has a thickness of less than 200 nanometers.

In a twenty-fifth aspect according to any of the nineteenth through twenty-fourth aspects, the electrode comprises metal having a work function of at least 4.5 electron volts.

In a twenty-sixth aspect according to the twenty-fifth aspect, the electrode comprises: Ni, Co, W, Pb, Pt, Ir, or Au.

In a twenty-seventh aspect according to any of the nineteenth through twenty-sixth aspects, the lower surface has a surface roughness (Ra) less than or equal to 0.4 micron.

In a twenty-eighth aspect, a method of preparing an electrostatic chuck comprises: on a ceramic layer that comprises an upper surface and a lower surface, the lower surface having a surface roughness (Ra) below 0.4 micron, forming an electrode layer on the lower surface.

In a twenty-ninth aspect according to the twenty-eighth aspect, the electrode comprises metal having a work function of at least 4.5 electron volts.

In a thirtieth aspect according to the twenty-eighth aspect or twenty-ninth aspect, the electrode comprises: Ni, Co, W, Pb, Pt, Ir, or Au.

The invention claimed is:

1. An electrostatic chuck comprising:
   a ceramic layer comprising an upper surface and a substantially smooth lower surface, wherein the substantially smooth lower surface of the ceramic layer has a surface roughness (Ra) less than or equal to 0.05 micron,
   an electrode at the lower surface of the ceramic layer, and
   a dielectric layer disposed between the ceramic layer and the electrode such that an upper surface of the dielectric layer is in contact with the substantially smooth lower surface of the ceramic layer and a lower surface of the dielectric layer is in contact with the electrode.

2. The electrostatic chuck of claim 1, wherein the dielectric layer is a CVD dielectric layer, an ALD dielectric layer, or a PECVD dielectric layer deposited onto the lower surface.

3. The electrostatic chuck of claim 1, wherein the dielectric layer has a thickness of less than 200 nanometers.

4. The electrostatic chuck of claim 1, wherein the dielectric layer comprises dielectric material that is different from ceramic material of the ceramic layer.

5. The electrostatic chuck of claim 1, wherein the dielectric layer comprises: alumina ($Al_2O_3$), a silicon-based ceramic material (e.g., SiO, SiN), a metal oxide such as zirconium oxide or hafnium oxide.

6. The electrostatic chuck of claim 1, wherein the ceramic layer comprises alumina and the dielectric layer comprises alumina.

7. The electrostatic chuck of claim 1, wherein the electrode comprises metal having a work function of at least 4.5 electron volts.

8. The electrostatic chuck of claim 7, wherein the electrode comprises metal selected from Ni, Co, W, Pb, Pt, Ir, and Au.

9. The electrostatic chuck of claim 1, wherein the ceramic layer comprises alumina.

10. The electrostatic chuck of claim 1, wherein the dielectric layer is an alumina ALD dielectric layer.

11. A method of using an electrostatic chuck of claim 1, the method comprising:
    supporting a semiconductor wafer at the upper surface,
    applying a voltage to the electrode to induce an opposite voltage in the semiconductor wafer,
    processing the semiconductor wafer,
    removing the voltage from the electrode, and
    lifting the wafer from the upper surface.

12. The method of claim 11, wherein the voltage is a direct current voltage.

13. A method of preparing an electrostatic chuck, the method comprising:
    on a ceramic layer that comprises an upper surface and a substantially smooth lower surface, forming a dielectric layer on the lower surface, wherein the substantially smooth lower surface of the ceramic layer has a surface roughness (Ra) less than or equal to 0.05 micron, and
    forming an electrode layer on the dielectric layer such that the dielectric layer is disposed between the ceramic layer and the electrode wherein an upper surface of the dielectric layer is in contact with the lower surface of the ceramic layer and a lower surface of the dielectric layer is in contact with the electrode.

14. The method of claim 13, comprising forming the dielectric layer by a method selected from chemical vapor deposition, plasma-assisted chemical vapor deposition, and atomic layer deposition.

15. The method of claim 13, further comprising forming the dielectric layer by atomic layer deposition.

16. The method of claim 13, further comprising depositing the electrode layer by a method selected from chemical vapor deposition, plasma-enhanced chemical vapor deposition, and atomic layer deposition.

17. The method of claim 13, wherein the dielectric layer comprises: alumina ($Al_2O_3$), a silicon-based ceramic material (e.g., SiO, SiN), a metal oxide such as zirconium oxide or hafnium oxide.

18. The method of claim 13, wherein the dielectric layer has a thickness of less than 200 nanometers.

19. The method of claim 13, wherein the electrode comprises metal having a work function of at least 4.5 electron volts.

20. The method of claim 19, wherein the electrode comprises: Ni, Co, W, Pb, Pt, Ir, or Au.

\* \* \* \* \*